United States Patent
Hortig et al.

(10) Patent No.: US 9,453,745 B2
(45) Date of Patent: Sep. 27, 2016

(54) SENSOR MODULE AND METHOD FOR PRODUCING A SENSOR MODULE

(75) Inventors: Michael Hortig, Eningen U.A. (DE); Thomas Schrimpf, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 583 days.

(21) Appl. No.: 13/586,053

(22) Filed: Aug. 15, 2012

(65) Prior Publication Data
US 2013/0044437 A1    Feb. 21, 2013

(30) Foreign Application Priority Data
Aug. 16, 2011 (DE) .................. 10 2011 081 016

(51) Int. Cl.
| | | |
|---|---|---|
| G01D 11/24 | (2006.01) | |
| H05K 5/00 | (2006.01) | |
| B81C 1/00 | (2006.01) | |

(52) U.S. Cl.
CPC ......... *G01D 11/245* (2013.01); *B81C 1/00333* (2013.01); *H05K 5/0078* (2013.01); *B81B 2201/0235* (2013.01); *Y10T 29/49885* (2015.01)

(58) Field of Classification Search
CPC .......... B81B 2201/0235; B81B 2201/026429; B81C 1/00325; B81C 1/00333; B81C 1/00269; G01D 11/245; G01P 1/023; H05K 5/0004; H05K 5/0078
USPC .................. 29/595, 832, 841, 842; 257/727; 438/121, 125, 127
See application file for complete search history.

(56) References Cited

U.S. PATENT DOCUMENTS

| | | | |
|---|---|---|---|
| 8,148,187 B2 | 4/2012 | Ratzel et al. | |
| 2007/0238262 A1* | 10/2007 | Summers ............ | B81C 1/00269 438/455 |
| 2009/0027861 A1* | 1/2009 | Ohl ...................... | H05K 5/0078 361/728 |
| 2009/0151451 A1* | 6/2009 | Ratzel .................. | B81B 3/0078 73/488 |
| 2010/0309637 A1 | 12/2010 | Hortig et al. | |
| 2012/0144915 A1 | 6/2012 | Ratzel et al. | |

FOREIGN PATENT DOCUMENTS

| | | |
|---|---|---|
| DE | 10 2007 052 366 | 5/2009 |
| DE | 10 2007 057 441 | 6/2009 |

* cited by examiner

*Primary Examiner* — Peter DungBa Vo
*Assistant Examiner* — Jeffrey T Carley
(74) *Attorney, Agent, or Firm* — Norton Rose Fulbright US LLP

(57) ABSTRACT

A method for producing a sensor module, in which a line part is provided in a first production step, which includes at least one receiving region for the force-fitting and/or form-fitting accommodation of a sensor element, and in a second production step for producing a housing, the line part is extrusion-coated with a plastic material in such a way that the at least one receiving region remains generally free of plastic material, and the sensor element is fixed in place in force-fitting and/or form-fitting manner in the at least one receiving region in a third production step.

9 Claims, 2 Drawing Sheets

SENSOR MODULE AND METHOD FOR PRODUCING A SENSOR MODULE

CROSS REFERENCE

The present application claims the benefit under 35 U.S.C. §119 of German Patent Application No. DE 102011081016.1 filed on Aug. 16, 2011, which is expressly incorporated herein by reference in its entirety.

FIELD OF THE INVENTION

The present invention relates to a sensor module.

BACKGROUND INFORMATION

A conventional sensor module is described in German Patent Application No. DE 10 2007 057 441 A1. To produce the sensor element, a line part is fitted with a sensor element and subsequently extrusion-coated with a plastic material in a two-stage injection molding process in order to produce a housing. On one side, the line part forms the contacts for a mating plug, and on the other side, it forms the contacts to the sensor element. This method has the disadvantage that the line part is first fitted with the sensor element and the injection molding process is carried out only subsequently, so that the sensor characteristics of the sensor element can be affected by the forces arising during the injection-molding process and also by the produced heat.

Furthermore, a substrate element system having a first and a second substrate element is described in German Patent Application No. DE 10 2007 052 366 A1; in this case, a first sensor is situated on the first substrate element, and a second sensor is situated on the second substrate element. The first and the second substrate elements are realized as separate components, which are situated perpendicularly to each other. The perpendicular placement of the first and second sensor makes it possible to measure at least two vectorial quantities which are perpendicular to each other. More specifically, it is possible to subdivide the quantity to be measured into at least two individual directional components, using the two sensors which are independent of each other and situated perpendicularly relative to each other.

SUMMARY

The example method for producing a sensor module according to the present invention may have the advantage that the sensor element is fixed in place on the line part only after the line part has been extrusion-coated with the plastic material in order to produce the housing. This ensures that the heat and pressures occurring during the injection-molding process do not adversely affect the sensor characteristic of the sensor element. The measuring accuracy of the sensor element is therefore increased. In addition, a single-stage injection process suffices. Another advantage is that the sensor element is fixed in place on the line part in particular only in force-fitting and/or form-fitting manner, so that it is possible to mount the sensor element on the line part in a simple and rapid manner even after the housing has been produced. The housing preferably has a recess in the area of the receiving region, in which the sensor element is fixed in place on the line part. The example method according to the present invention makes it possible to form a recess which is only relatively small, because the easily realizable force- and form-fitting affixation of the sensor element on the line part is readily possible also within a relatively small recess.

The sensor element is preferably clamped into the receiving region, so that no complicated soldering, bonding or joining techniques are required. To form the recess, the second production step is carried out in such a way, for instance, that during the injection molding process a slider element is situated in the area of the recess to be formed, which has an outer geometry that corresponds to the recess to be formed, or it is carried out in such a way that a holding element, which has an outer geometry that corresponds to the recess to be formed, holds the line part in the region of the recess to be formed. The line part is electrically conductive and preferably includes a metallic line part, so that the sensor element is able to be contacted from outside the housing via the line part. The sensor element preferably includes an electrical, electronic, mechanical and/or micromechanical sensor, especially preferably an acceleration sensor, an angular acceleration sensor, a sensor for measuring an electrical field, and/or a sensor for measuring a magnetic field (e.g., a Hall-effect sensor).

According to one preferred specific embodiment, another line part, which has at least one additional receiving region corresponding to the receiving region, is provided in the first production step for the force-fitting and/or form-fitting accommodation of the sensor element; in the second production step for producing the housing, the line part and the additional line part are jointly extrusion-coated with a plastic material so as to produce a housing, such that the at least one receiving region and the at least one additional receiving region remain generally free of plastic material, and in a third production step, the sensor element is fixed in place in force-fitting and/or form-fitting manner both in the receiving region and in the further receiving region. As a result, the sensor element is advantageously able to be contacted from outside the housing, via two electrically conductive line parts which are insulated from each other. The line part and the further line part act as two-core interfaces, which allows the implementation of a bus-capable transmission system, especially also for the simultaneous communication with a multitude of sensor elements. The number of contacts is therefore reduced considerably. In particular the conventional relatively cost-intensive circuit boards, which are made of electrically non-conductive material in which a multitude of circuit tracks is embedded, are not required. As a result, the sensor module is more cost-effective.

According to one preferred specific embodiment, the line part and the additional line part are extrusion-coated in the second production process, such that an intermediate space between the receiving region and the further receiving region remains free of plastic material. During the second production step, a recess advantageously forms in the housing, via which the receiving region, the further receiving region and the intermediate space are accessible from outside the housing, so that the fitting with the sensor element in the third production step is possible without any problems.

In a fourth production step according to one preferred specific embodiment, the housing is sealed by a housing lid in the area of the sensor element. This advantageously protects the sensor element from harmful external effects such as soiling, the introduction of mechanical forces, moisture and the like. The housing lid is mounted on the housing either in detachable manner or permanently. Preferably, the housing lid is bonded to the housing in a manner that produces a hermetically sealed lid connection.

In the third production step according to one preferred specific embodiment, the sensor element is fixed in place in the receiving region with the aid of a fixation clamp of the line part, the sensor element in the further receiving region preferably being mounted with the aid of an additional fixation clamp of the further line part. As a result, a relatively secure and easily implementable fixation of the sensor element on the line part is obtained in an advantageous manner. The fixation clamp preferably includes a leg which projects from the line part and ends in a clamping region, which is situated generally parallel to the line part at a distance from the receiving region. The clamping region is preferably elastically prestressed in the direction of the receiving region, so that the sensor element is able to be clamped between the fixation clamp and the receiving region. In the third production step, the sensor element is slipped into the receiving region, preferably from the side, i.e., parallel to the line part, which tensions the fixation clamp accordingly. Thus, a form-fitting and force-fitting fixation of the sensor element is achieved, in particular. The fixation clamp preferably includes a metallic tab which is partially stamped into the line part and bent outwardly. The fixation clamp is preferably also suitable for contacting the sensor element, for instance if the sensor element is provided with a contact surface (contact pad) on a side facing away from the receiving region. The further fixation clamp is developed analogously to the fixation clamp, so that the sensor element is fixed in place independently, both by the affixation clamp on the line part and by the further affixation clamp on the further line part.

According to one preferred specific embodiment, an end region of the line part is extrusion-coated with plastic material in the second production step, such that the line part in the end region is spaced apart from the housing in order to form a plug housing; an additional end region of the further line part is preferably extrusion-coated with plastic material in such a way that the further line part is spaced apart from the housing in the further end region in order to form the plug housing. During the second production method, it is thus advantageously the case that not only the housing for protecting the sensor element is produced, but simultaneously also a plug housing, in the form of a socket, via which the sensor module is able to be contacted in an uncomplicated manner. The geometrical form of the socket is preferably selected in such a way that conventional mating plug elements are able to be inserted.

According to one preferred specific embodiment, the extrusion-coating takes place in the second production step in such a way that an end region of the line part projects from the housing so as to form a plug, and that an additional end region of the further line part preferably projects from the housing so as to form the plug. In the second production method, it is thus advantageously the case that not only the housing for protecting the sensor element is produced, but simultaneously also a plug housing, in the form of a plug element, which is able to be plugged into correspondingly formed sockets in order to contact the sensor module. The geometrical form of the plug housing is preferably developed so as to allow the plug element to be inserted into conventional mating plug elements.

According to one preferred specific embodiment, in a first partial step of the first production step, a line part having at least one first and one second receiving region is provided, and in a second partial step of the first production step, the line part is bent in such a way that the second receiving region is aligned at an angle with respect to the first receiving region, the line part being extrusion-coated with a plastic material in the second production step for producing the housing, such that both the first receiving region and the second receiving region remain generally free of plastic material; and in the third production step, a first sensor element in the first receiving region and a second sensor element in the second receiving region are fixed in place in force-fitting and/or form-fitting manner. This makes it possible to measure vectorial quantities, e.g., accelerations, rotary accelerations, magnetic fields, electric fields and the like along at least two directions which deviate from each other. This in particular makes it possible to subdivide a quantity to be measured into at least two individual directional components, using the two sensor elements disposed at an angle relative to each other. In contrast to the related art, this requires only the line part, which is simply bent between the first and second receiving region, i.e., bent at an angle or shaped to form an angle. The conventional use of two separate substrates or circuit boards is not required in this case, so that the relatively complicated joining and connecting technologies for connecting such separate substrates or circuit boards are completely dispensed with. In the bent region, the line part is preferably bent in such a way that a main extension plane of the line part in the first receiving region and a main extension plane of the line part in the second receiving region form an angle of generally 90 degrees. It is furthermore possible that the line part has a third line part, in which a third sensor element is situated, and that the line part includes a further bent region. The third receiving region is preferably angled both with respect to the first receiving region and with respect to the second receiving region, especially at an angle of 90 degrees. In this way it is advantageously possible to use the third sensor element to measure vectorial quantities, e.g., accelerations, rotary accelerations, magnetic fields, electric fields and the like along three spatial directions which deviate from each other. This in particular makes it possible to subdivide a quantity to be measured into all three directional components, using the three sensor elements disposed at an angle with respect to each other. It is furthermore possible that a plurality of first sensor elements is situated in the first receiving region, a plurality of second sensor elements is situated in the second receiving region, and/or a plurality of third sensor elements is situated in the third receiving region.

According to one preferred specific embodiment, a further line part, which has at least one further first and one further second receiving region, is provided in the first partial step and the further line part is bent in the second partial step, in such a way that the further second receiving region is aligned at an angle with respect to the further first receiving region, it being the case that the line part and the further line part are jointly extrusion-coated with a plastic material in the second production step, in order to produce the housing, such that both the first receiving region, the second receiving region, the further first receiving region and the further second receiving region remain generally free of plastic material; and in the third production step, a first sensor element in the first receiving region and in the further first receiving region, and a second sensor element in the second receiving region and in the further second receiving region are fixed in place in force-fitting and/or form-fitting manner. As a result, the first and second sensor elements disposed at an angle relative to each other are advantageously able to be contacted via two-core interfaces in each case.

A further subject matter of the present invention is a sensor module, which is produced according to the example method of the present invention. For the reasons enumerated above, the sensor module according to the present invention advantageously is much more cost-effective than the conventional sensor modules.

Exemplary embodiments of the present invention are illustrated in the figures and explained in greater detail below.

DETAILED DESCRIPTION OF EXAMPLE EMBODIMENTS

In the various figures, identical parts have always been provided with the same reference symbols and are therefore usually labeled or mentioned only once.

Figure 1:
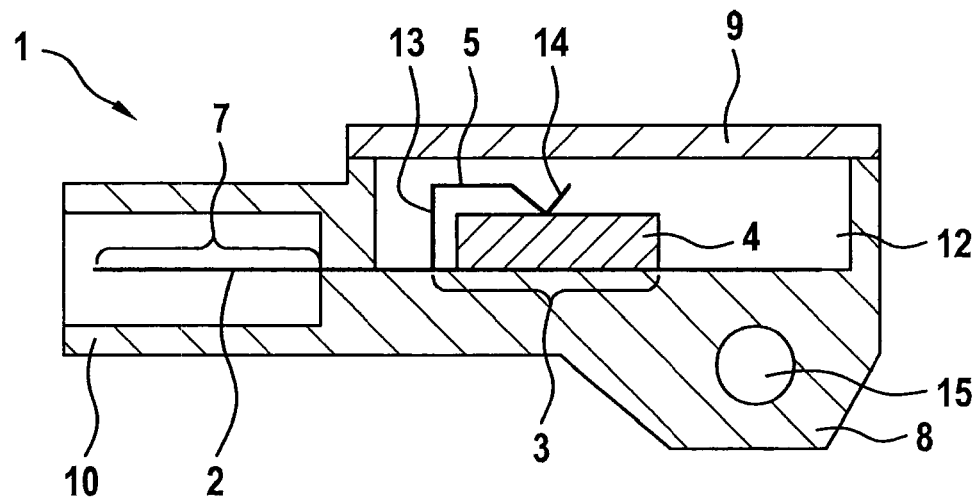
FIG. 1 shows a schematic sectional view of a sensor module produced according to a method according to a first specific embodiment of the present invention.

FIG. 1 shows a schematic sectional view of a sensor module 1 according to a first specific embodiment of the present invention. Sensor module 1 has a line part 2 produced in a first production step, which is developed as metallic line part. Line part 2 has a receiving region 3, in which a sensor element 4 is to be affixed in force- and form-fitting manner. In addition, sensor element 1 has a further line part 2', which cannot be seen in the illustration in FIG. 1 for reasons of perspective, since further line part 2' is situated behind line part 2 when viewed from the reader's perspective. Further line part 2' has a similar design as line part 2. In a second production step, line part 2 and further line part 2' are partially extrusion-coated with a plastic material in an injection-molding process, so that a housing 8 is formed. The injection molding process is carried out in such a way that housing 8 is set apart from line part 2 or further line part 2' in an end region 7 of line part 2 and from a further end region 7' (also not visible in FIG. 1) of further line part 2'. In this way a socket is formed, into which a corresponding mating plug element (not shown) is able to be inserted. The injection-molding process is furthermore carried out in such a way that the area of receiving region 3 remains free of plastic material. As a result, a recess 12 develops in housing 8, through which receiving region 3 is accessible from outside housing 8. In addition, the injection-molding process is implemented so as to form an affixation bore 15 in housing 8. Sensor module 1 is able to be fixed in place by means of affixation bore 15, such as inside a motor vehicle.

In a subsequent third production step, a sensor element 4 is mounted on line part 2 inside recess 12 in receiving region 3. Line part 2 has a fixation clamp 5 in receiving region 3. Fixation clamp 5 preferably includes a leg 13 which projects from the line part and ends in a clamping region 14, which is situated generally parallel to line part 2 and at a distance from the receiving region 3. Clamping region 14 preferably is elastically prestressed in the direction of receiving region 3, so that sensor element 4 is able to be clamped between fixation clamp 5 and receiving region 3. To this end sensor element 4 is inserted into receiving region 3 in the third production step, preferably laterally, i.e., parallel to line part 2. This spreads fixation clamp 5 apart, i.e., clamping region 14 is moved away from line part 2, so that clamping region 14 has prestressing in the direction of receiving region 3, and sensor element 4 thus is clamped between clamping region 14 and receiving region 3 in force- and form-fitting manner. Because of the direct contact between sensor element 4 and line part 2 in clamping region 14 and in receiving region 3, sensor element 4 is able to be contacted from outside housing 8 via line part 2. For this purpose sensor element 4 preferably has a corresponding contact surface (contact pad) in the area of clamping region 14 and/or receiving region 3. When mounting sensor element 4 in receiving region 3, sensor element 4 is analogously fixed in place in a similarly realized further receiving region 3' (not shown in FIG. 1 for perspective reasons) of further line part 2'. Line part 2 and further line part 2' act as two-core interfaces, so that a communication with sensor element 4 via a transmission system having bus capability is possible from outside housing 8. In a final fourth production step, recess 12 is hermetically sealed by a housing lid 9, housing lid 9 preferably being bonded to housing 8.

Figure 2:
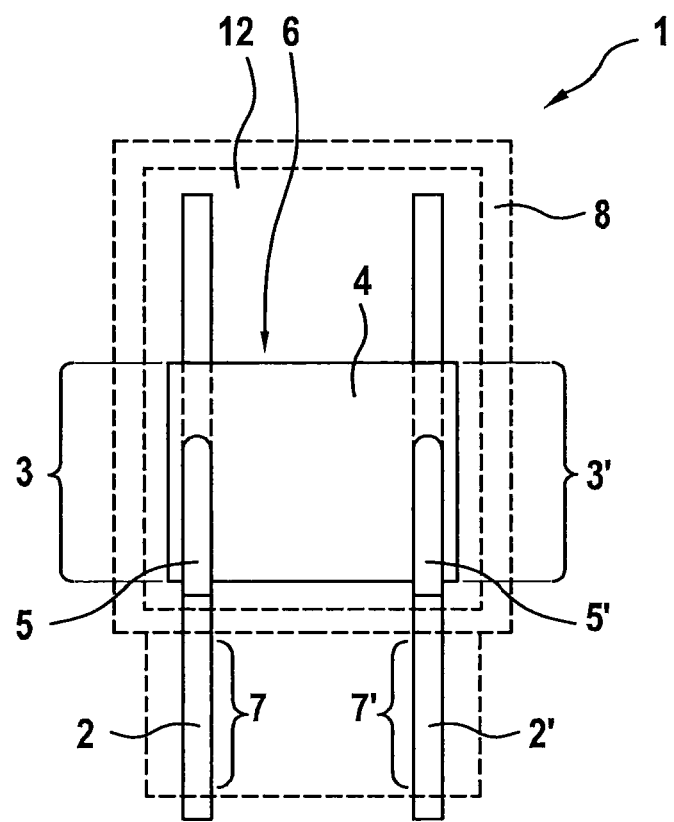
FIG. 2 shows a schematic plan view of a sensor module produced according to a method according to the first specific embodiment of the present invention.

FIG. 2 shows a schematic plan view of a sensor module 1 produced by a method according to the first specific embodiment of the present invention; the plan view shows sensor module 1 illustrated in FIG. 1 from a bird's-eye perspective, in which housing lid 9 is not shown for reasons of clarity, and housing 8 is indicated only schematically by dashed lines. It is clear from FIG. 2 that line part 2 and further line part 2' have an identical design, extend parallel to each other and are electrically insulated from each other.

Figure 3:
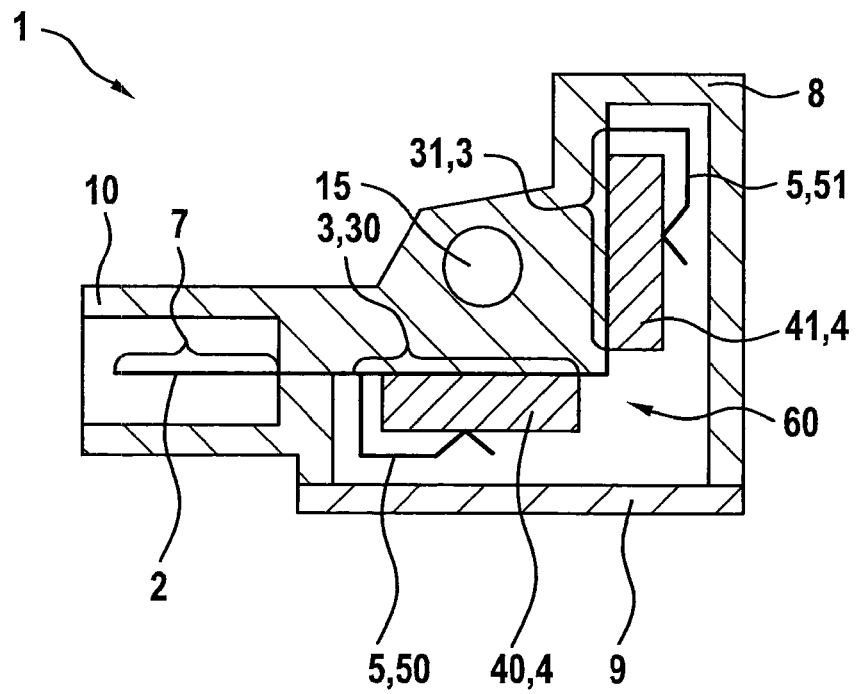
FIG. 3 shows a schematic sectional view of a sensor module produced according to a method according to a second specific embodiment of the present invention.

FIG. 3 shows a schematic sectional view of a sensor module 1 produced by a method according to a second specific embodiment of the present invention; the second specific embodiment essentially corresponds to the first specific embodiment shown in FIGS. 1 and 2, line part 2 of sensor module 1 according to the second specific embodiment also having a second receiving region 31 in addition to a first receiving region 30, in contrast to the first specific embodiment. Between first and second receiving regions 30, 31, line part 2 includes a region 60, which is bent at an approximately 90 degree angle. As a result, the plane of first receiving region 30 extends generally at a right angle to the plane of second receiving region 31. Sensor module 1 once again has an identically implemented second line part 2', which analogously includes a further first receiving region and a further second receiving region extending perpendicularly to it. In the second production step, line part 2 and further line part 2' are extrusion-coated such that both the first receiving region 30, second receiving region 31, further first receiving region 30' and further second receiving region 31' are situated in the area of recess 12. First receiving region 30, second receiving region 31, intermediate region 6 (not shown in FIG. 3 for perspective reasons) between first receiving region 30 and second receiving region 31, the further first receiving region, the further second receiving region, and a further intermediate region between the further first receiving region and the further second receiving region are therefore free of plastic material. In the third production step, first sensor element 40 is clamped into place in first and further first receiving region 30, while second sensor element 41 is clamped into place in second and further second receiving region 31. As a result, sensor module 1 allows a two-channel measurement.

Figure 4:
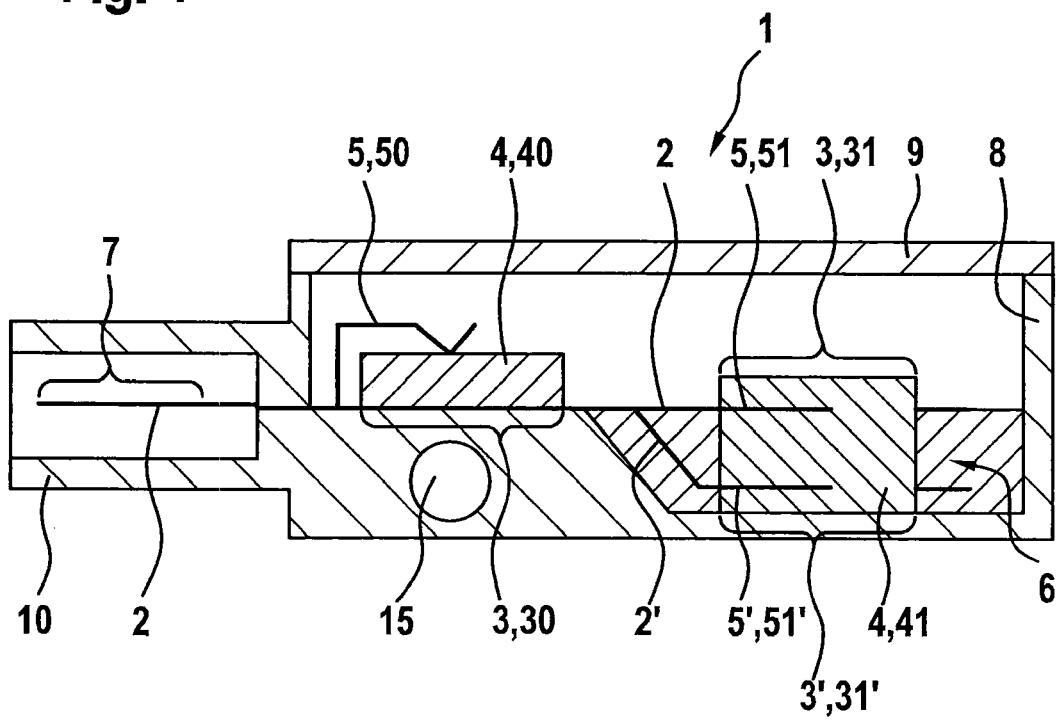
FIG. 4 shows a schematic sectional view of a sensor module produced according to a method according to a third specific embodiment of the present invention.

FIG. 4 shows a schematic sectional view of a sensor module 1 produced by a method according to a third specific embodiment of the present invention, the third specific embodiment generally resembling the second specific embodiment illustrated in FIG. 3. In contrast to the second specific embodiment, however, line part 2 and further line part 2' in sensor module 1 according to the third specific embodiment are turned or rotated by 90 degrees about an axis of rotation extending parallel to the longitudinal extension of line part 2. It is clear from FIG. 2 that second sensor element 41 is fixed in place in force- and form-fitting manner both in second receiving region 31 using a second fixation clamp 51, and in further second receiving region 31', using a further second fixation clamp 51'.

What is claimed is:

1. A method for producing a sensor module, comprising:
providing, in a first production step, a line part which includes at least one receiving region for at least one of force-fitting and form-fitting accommodation of a sensor element;
producing a housing by extrusion-coating, in a second production step, including extrusion coating a portion of the line part with a plastic material in such a way that the at least one receiving region is located in a recess free of material and the recess is formed in the plastic material during the second production step; and
fixing, in a third production step, the sensor element in place in at least one of force-fitting and form-fitting manner in the at least one receiving region, the third production step being implemented temporally after the second production step.

2. The method as recited in claim 1, further comprising:
providing, in the first production step, a further line part, which has at least one further receiving region corresponding to the receiving region, for the force-fitting and/or form-fitting accommodation of the sensor element, wherein the line part and the further line part are jointly extrusion-coated with the plastic material in the second production step to produce the housing such that the at least one receiving region and the at least one further receiving region remain free of material to form a further recess in the housing, and wherein in a third production step, the sensor element is fixed in place in the at least one of the force-fitting and form-fitting manner both in the receiving region and in the further receiving region.

3. The method as recited in claim 2, wherein in the second production step, the line part and the further line part are extrusion-coated so that an intermediate region between the receiving region and the further receiving region remains free of material to form a continuous recess in the housing.

4. The method as recited in claim 1, wherein in a fourth production step, the housing is sealed by a housing lid in an area of the sensor element.

5. The method as recited in claim 2, wherein in the third production step, the sensor element is fixed in place in the receiving region using a fixation clamp of the line part, the sensor element being fixed in place in the further receiving region by a further fixation clamp of the further line part.

6. The method as recited in claim 2, wherein in the second production step, an end region of the line part is extrusion-coated with plastic material such that the line part in the end region is set apart from the housing to form a plug housing, an additional end region of the further line part being extrusion-coated with plastic material so that the further line part in the further end regions is set apart from the housing to form the plug housing.

7. The method as recited in claim 2, wherein in the second production step, the extrusion-coating takes place in such a way that an end region of the line part projects from the housing to form a plug, and a further end region of the further line part projects from the housing to form the plug.

8. A method for producing a sensor module, comprising:
providing, in a first production step, a line part which includes at least one receiving region for at least one of force-fitting and form-fitting accommodation of a sensor element;
extrusion-coating, in a second production step, the line part with a plastic material for producing a housing in such a way that the at least one receiving region remains free of plastic material; and
fixing, in a third production step, the sensor element in place in at least one of force-fitting and form-fitting manner in the at least one receiving region, the third production step being implemented temporally after the second production step,
wherein in a first partial step of the first production step, the line part is provided, which has at least one first and one second receiving region, and in a second partial step of the first production step, the line part is bent so that the second receiving region is aligned at an angle with respect to the first receiving region, and in the second production step, the line part is extrusion-coated with a plastic material in order to produce the housing, such that both the first receiving region and the second receiving region remain free of plastic material, and in the third production step, the sensor element in the first receiving region and a second sensor element in the second receiving region are fixed in place in at least one of a force-fitting and form-fitting manner.

9. A method for producing a sensor module, comprising:
providing, in a first production step, a line part which includes at least one receiving region for at least one of force-fitting and form-fitting accommodation of a sensor element;
extrusion-coating, in a second production step, the line part with a plastic material for producing a housing in such a way that the at least one receiving region remains free of plastic material; and
fixing, in a third production step, the sensor element in place in at least one of force-fitting and form-fitting manner in the at least one receiving region, the third production step being implemented temporally after the second production step,
wherein in the first partial step, a further line part is provided, which has at least one further first and one further second receiving region, and in the second partial step the further line part is bent so that the further second receiving region is aligned at an angle with respect to the further first receiving region, and the line part and the further line part being jointly extrusion-coated with the plastic material in the second production step to produce the housing, so that both the first receiving region, the second receiving region, the further first receiving region and the further second receiving region are free of plastic material; and in the third production step, the sensor element in the first receiving region and in the further first receiving region, and a second sensor element in the second receiving region and in the further second receiving region are fixed in place in at least one of a force-fitting and form-fitting manner.

* * * * *